United States Patent [19]

Horwitz

[11] Patent Number: 4,704,544

[45] Date of Patent: Nov. 3, 1987

[54] COMPLEMENTARY CURRENT MIRROR LOGIC

[75] Inventor: Christopher M. Horwitz, Sydney, Australia

[73] Assignee: Unisearch Limited, New South Wales, Australia

[21] Appl. No.: 854,543

[22] Filed: Apr. 22, 1986

[51] Int. Cl.[4] .................. H03K 19/082; H03K 19/094
[52] U.S. Cl. .................................... 307/270; 307/443; 307/454; 307/500; 307/254
[58] Field of Search ................ 330/228; 307/443, 446, 307/454–456, 459, 477, 480, 500, 570, 270, 254–255, 451–452, 481

[56] References Cited

U.S. PATENT DOCUMENTS

| | | | |
|---|---|---|---|
| 4,287,435 | 9/1981 | Cavaliere et al. | 307/455 X |
| 4,380,710 | 4/1983 | Cohen et al. | 307/451 X |
| 4,433,258 | 2/1984 | Kaneko et al. | 307/456 |
| 4,543,499 | 9/1985 | Kaneko et al. | 307/459 X |
| 4,626,710 | 12/1986 | Wiedmann | 307/456 X |
| 4,629,913 | 12/1986 | Lechner | 307/455 X |

OTHER PUBLICATIONS

Berger et al., "Transistor-Transistor Logic Circuit", IBM T.D.B., vol. 16, No. 8, Jan. 1974, p. 2643.
Farley et al., "Totem-Pole Logic", IBM T.D.B., vol. 20, No. 9, Feb. 1978, pp. 3466-3467.
IEEE Journal of Solid-State Circuits, vol. SC-12, No. 5, Oct. 1977 "Threshold 12L and its Applications to Binary Symmetric Functions and Multivalued Logic" by T. Tich Dao, pp. 463-472.
IEEE Journal of Solid-State Circuits, vol. SC-7, No. 5, Oct. 1972 "Integrated Injection Logic: A New Approach to LSI" by Kees Hart and Arie Slob, pp. 346-351.
McGraw-Hill Book Co., Taipei, Taiwan, "VLSI Technology" by S. M. Sze, pp. 445-505.
Proceedings of the IEEE, vol. 70, No. 5, May 1982 "A Comparison of Semiconductor Devices for High-Speed Logic by Paul M. Solomon, pp. 489-345.
IEEE Transactions on Computers, vol. c-33, No. 12, Dec. 1984, "Multiple-Valued Logic—Its Status and Its Future by Stanley L. Hurst, pp. 1160-1179.
IBM Journal-Jul. 1957, "Two Collector Transistor for Binary Full Addition, by R. F. Rutz, pp. 212-222.
IEEE Journal of Solid-State Circuits, vol. sc-7, No. 5, Oct. 1972 "A New Complementary Bipolar Transistor Structure", by Stephen C. Su and James D. Meindl, pp. 351-647.
IEEE Journal of Solid-State Circuits, vol. SC-11, No. 5, Oct. 1972 "Folded-Collector Integrated Injection Logic, by Mohamed I. Elmasry, pp. 644-647.
IEEE Journal of Solid-State Circuits, vol. SC-7, No. 5, Oct. "Merged-Transistor Logic (MTL)—A Low Cost Bipolar Logic Concept by Horst H. Berger and Siegfried K. Wiedmann.

Primary Examiner—Stanley D. Miller
Assistant Examiner—D. R. Hudspeth
Attorney, Agent, or Firm—Nixon & Vanderhye

[57] ABSTRACT

A new logic circuit construction in which gates are formed by appropriate interconnections of complementary current-mirror cells. With a signal applied, the resulting logic circuit draws a current drain which rises with power supply voltage, as does the speed of the circuit. With no signal the current drain of the circuit is small. Clocked circuits using this logic can use one clock line. With three states available in the clock line, a non-overlapping two-phase clock is automatically obtained with a simple oscillating signal. This logic circuit is also capable of providing a weighted input or output, enabling threshold logic ("multiple-valued logic") to be performed.

26 Claims, 24 Drawing Figures

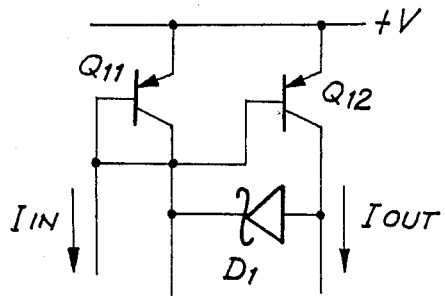
FIG. 4(a)
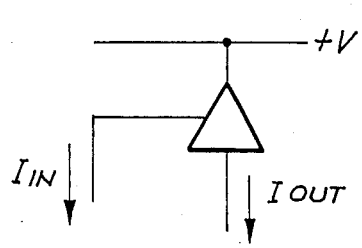
FIG. 4(b)
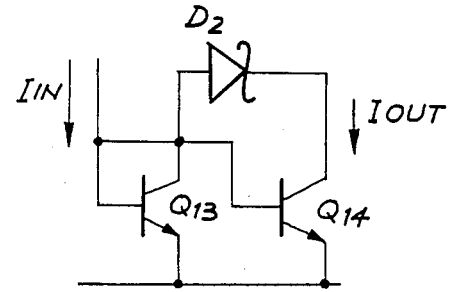
FIG. 4(c)
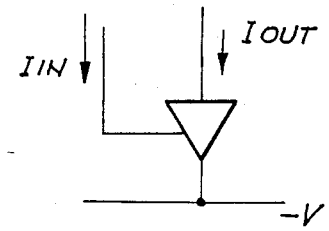
FIG. 4(d)
FIG. 8
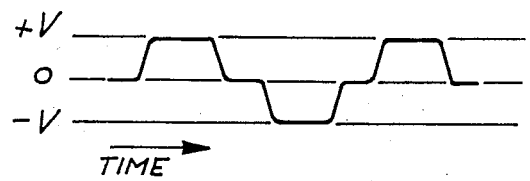

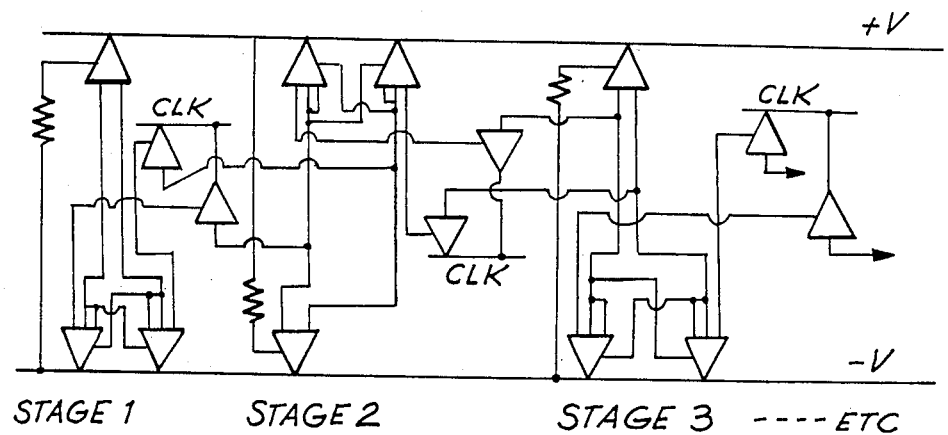
FIG. 7(a)
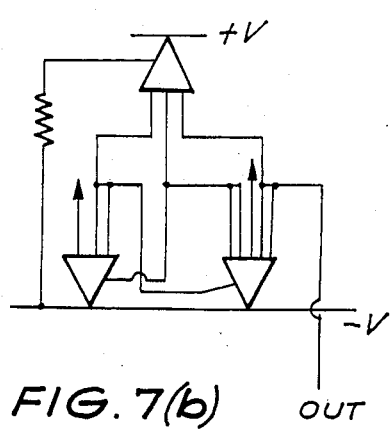
FIG. 7(b) OUT
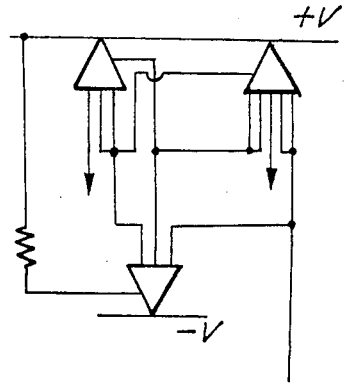
FIG. 7(c) OUT

COMPLEMENTARY CURRENT MIRROR LOGIC

BACKGROUND OF THE INVENTION

The present invention relates generally to the design of digital logic circuits and in particular it provides the basis for a new family of logic circuits which operate upon current signals rather than voltage signals. Logic circuits according to the invention may be designed to perform binary and higher order multiple-valued logic functions.

Binary logic circuits are the basis of present-day digital computing. There are many competing families of such circuits. Most use voltage levels (as distinct from current levels) at the input and output to describe the operation of the circuit. Such families include ECL (Emitter - Coupled Logic), TTL (Transistor - Transistor Logic), I²L (Integrated - Injection Logic), NMOS (N-channel MOS) and CMOS (complementary MOS). These families have been listed in a rough order of power consumption and speed, with ECL consuming most power but also operating at the highest speed.

References to prior art logic families are available in S. M. Sze (ed.), "VLSI Technology", New York: McGraw-Hill, 1983 and W. P. M. Solomon, "A Comparison of Semiconductor Devices for High-Speed Logic", Proc. IEEE, Volume 70, 1982, pages 489–509. References to both prior art logic families and to multi-valued logic and its implementation may be found in Stanley L. Hurst, "Multiple-Valued Logic—Its Status and Its Future", IEEE Transactions on Computers, Vol. C-33, No. 12, December 1984, pages 1160 to 1179.

SUMMARY OF THE INVENTION

The present invention consists in an electronic digital logic circuit comprising at least one positive current source, at least one negative current source and an output, each positive current source producing a positive current and each negative current source producing a negative current and the respective positive and negative currents being summed algebraically to produce an output current at the output of the logic circuit.

The present invention provides the basis for a family of logic circuits which can act as a replacement for all of the prior art logic families referred to above. When operated at high voltage logic devices using the present invention behave like ECL, and when operated at low voltage these devices behave somewhat like the CMOS Logic family. When implemented using bipolar junction transistor technology, logic in accordance with the present invention utilises current levels rather than voltage levels to describe the state of the logic elements. This is similar to another high-speed logic family, CML (Current Mode Logic), a variant of ECL. Unlike CML, however, in logic families according to the present invention, which are hereinafter referred to as Complementary Current Mirror Logic (CCML), the input and output currents can have variable weights. Combined with analog summation of currents at the input node of a gate, this new logic circuit permits simplification of gate designs. It may even allow correlation between digital words to be performed in a simpler fashion than is possible with prior art binary gate logic.

The logic circuit of the invention has some similarities with many types of digital logic circuits. It is similar to "Folded Collector Integrated Injection Logic" (e.g. M. I. Elmasry, IEEE Journal of Solid-State Circuits, Volume SC-11, No. 5, October 1976, pages 644–647), with two changes: firstly the integrated injector, although possibly useful, is not a necessary component of the new logic: Secondly, a complementary image of the basic inverter cell is used as a load in the present invention, replacing the integrated injector to the following stage. ("In this context, Complementary" is used to signify that PNP devices replace NPN devices, and vice-versa).

The logic according to the invention is also similar to circuits described in "A New Complementary Bipolar Transistor Structure" (S. C. Su and J. D. Meindl, IEEE Journal of Solid-State Circuits, Volume SC-7, No. 5, October 1972, pages 351–357) and in "Bipolar Complementary Logic (CTL)" (S. K. Wiedmann and H. H. Berger, in Proceedings of the First European Solid-State Circuits Conference, Canterbury, U.K. September 1975, pages 36–39, referred to by P. M. Solomon, "A Comparison of Semiconductor Devices for High-Speed Logic", Proceedings of the IEEE, Volume 70, No. 5, May 1982, pages 489–509, page 505). The similarity lies in the use of complementary bipolar transistors to perform logic functions: The dissimilarity rests in the "Folded Collector" (terminology of Elmasry, above) or "Current Mirror" configuration of the complementary elements. Without the current mirror element of the present invention the complementary bipolar stage becomes excessively dependent on power supply voltage due to uncontrolled collector current levels.

The most familiar description of the present invention would be in terms of the current mirrors used by analog amplifier designers: here we are employing complementary current mirror elements in configurations designed to provide logic inputs and outputs.

We will see that logical operations can be performed using weighted summations of both positive and negative signals feeding into one input node; This capability is unavailable in any of the logic forms reviewed by Hurst ("Multiple-Valued Logic . . . ," above), with a single exception. The "Two collector transistor for binary full-addition" (R. F. Rutz, IBM Journal of research and Development, Volume 1, pages 212 to 223 1957) is capable of processing a weighted summation of input signals of any polarity. However that device requires external resistors and buffering devices, and does not resemble the Complementary Current Mirror Logic (CCML) of the present invention in form or function.

BRIEF DESCRIPTION OF THE DRAWINGS

FIG. 1 illustrates the various components which are used as the basis of a logic circuit in accordance with an embodiment of the present invention, together with their schematic representation.

Figure 1A:
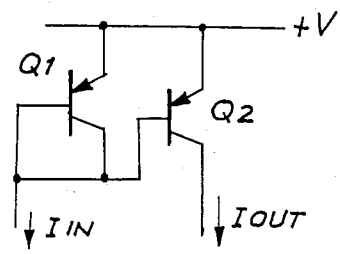
FIG. 1(a) illustrates a pull up cell.
Figure 3:
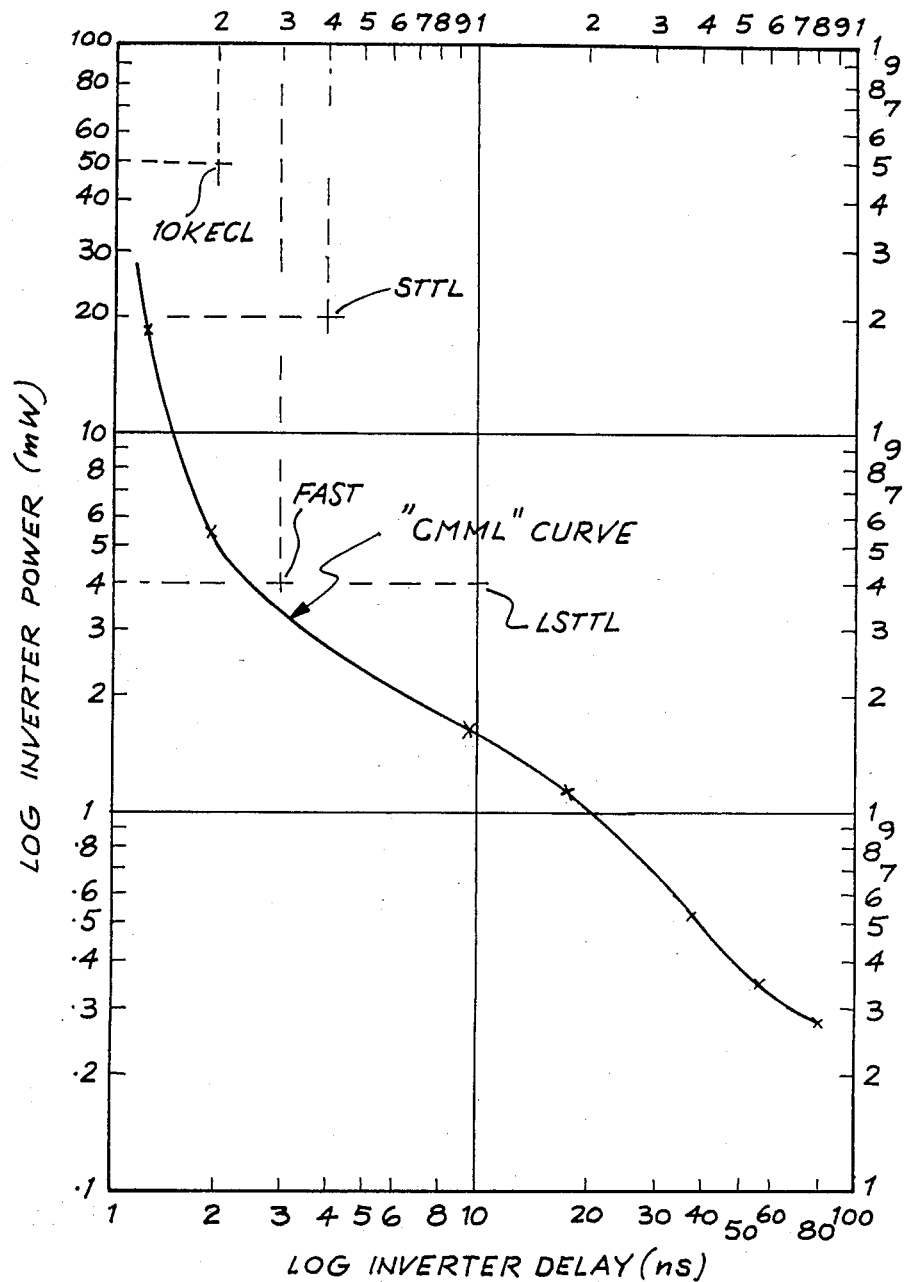
Figure 6:
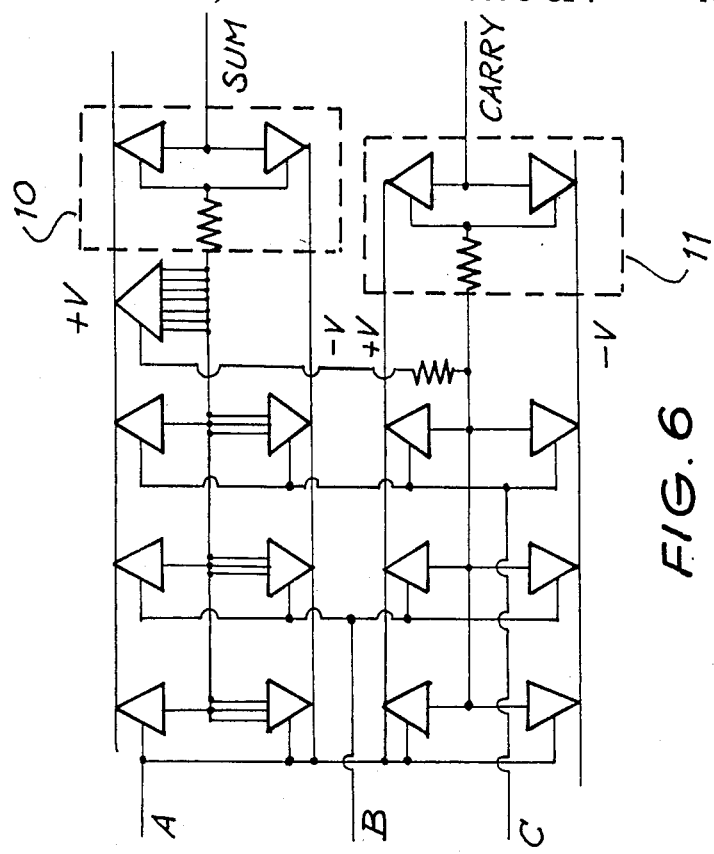
Figure 5A:
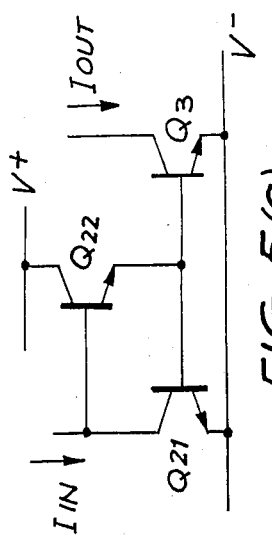
Figure 5B:
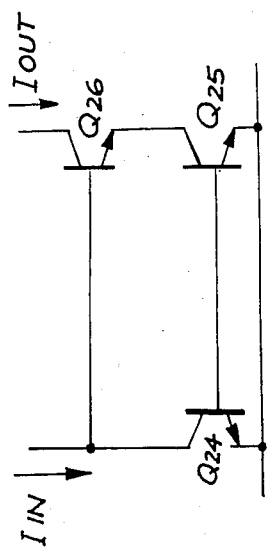
Figure 5C:
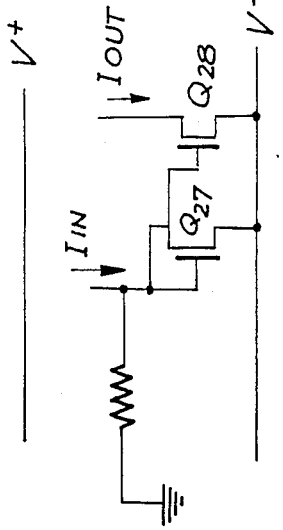

illustrating an inverter with a current gain of two inverters;

FIG. 3 graphically illustrates the power/delay curve for devices according to the invention, and compares this to power/delay characteristics of prior art logic families;

FIG. 4 illustrates (a) a pull-up cell including a Schottky diode, (b) the schematic symbol for the cell of FIG. 4(a), (c) a pull-down cell including a Schottky diode, and (d) the schematic symbol for the cell of FIG. 4(c);

FIGS. 5(a) & (b) illustrate alternative bipolar circuits for implementing the pull-down cell of FIG. 1(a), FIG. 5(c) illustrates an alternative MOS field-effect transistor (MOSFET) circuit for implementing the pull down cell of FIG. 1(a), FIG. 6 schematically illustrates a full adder implemented in accordance with the present invention;

FIG. 7(a) schematically illustrates a shift register implemented in accordance with the present invention, and FIG. 7(b) and (c) schematically illustrate two possible output buffers for the circuit of FIG. 7(a); and FIG. 8 graphically illustrates a clock waveform used with the shift register circuit of FIG. 7(a), as a function of time.

DETAILED DESCRIPTION

The elements making up an embodiment of the present invention are shown in FIG. 1. In FIG. 1(a), $Q_2$ performs as a pull-up transistor, controlled by the diode-connected transistor $Q_1$. An input current $I_{in}$ into $Q_1$ is reflected into an output current $I_{out}$ in the output transistor $Q_2$ having the same magnitude and polarity. This is the well-known "current mirror" action used extensively in analogue integrated circuits and even in multiple-valued digital integrated circuits based on the I²L logic family (see K. Hart, A. Slob, "Integrated injection logic—A new approach to LSI," IEEE Journal of Solid State Circuits, vol. SC-7, October 1972, pages 346-351; and T. T. Dao, "Threshold I²L and its application in binary symmetric functions and multi-valued logic", IEEE Journal of Solid State Circuits, Vol SC-12, October 1977, pages 463-475). There are however two differences between the above I²L circuits and the logic of the present invention; firstly I²L requires that every gate input have an "Integrated Injection" of current, and secondly the logic of the present invention utilises two polarities of basic cell, the first cell which is illustrated in FIG. 1(a) employing $Q_1$ and $Q_2$ to perform an inverting pull-up function, and the second cell which is illustrated in FIG. 1(c) employing $Q_3$ and $Q_4$ to perform an inverting pull-down function. No commonly used bipolar logic uses this complementary cell design. CMOS is in some respects similar, with its use of complementary N-and P-channel field effect transistors. The schematic symbols for the basic elements of FIG. 1(a) & (c) are illustrated in FIGS. 1(b) & (d) respectively.

One final circuit element is needed: a current source or a resistor, either of which serve to set the circuit current level. These are illustrated schematically in FIG. 1(e), (f) and (g).

Figure 1C:
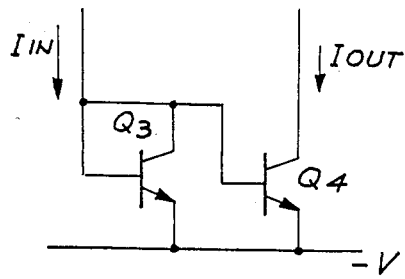
FIG. 1(c) illustrates a pull-down cell.
Figure 1B:
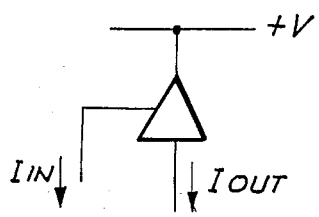
FIG. 1(b) illustrates a schematic symbol for the pull up cell of FIG. 1(a)
Figure 1D:
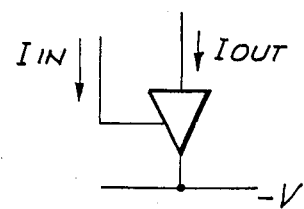
FIG. 1(d) illustrates a schematic symbol for the pull-down cell of FIG. 1(c)
Figure 1E:
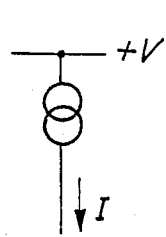
FIG. 1(e) illustrates a positive current source.
Figures 1F, 1G:
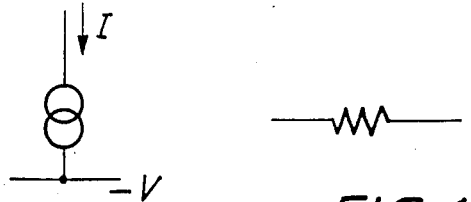
FIG. 1(f) illustrates a negative current source (current sink)
FIG. 1(g) illustrates a schematic symbol for a resistor.
Figure 1H:
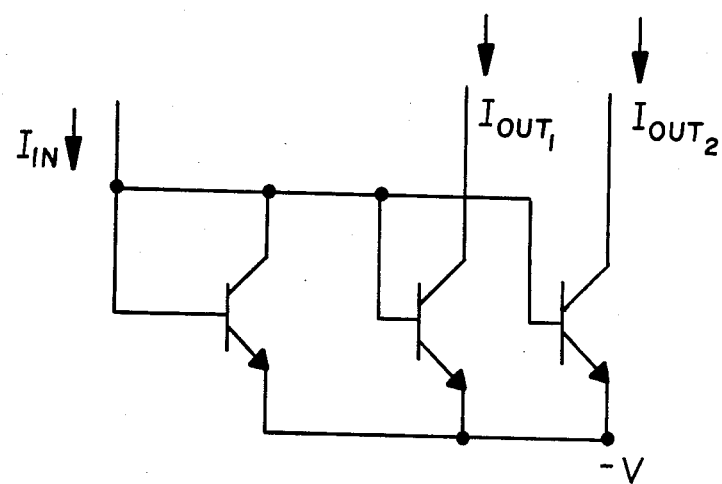
FIG. 1(h) illustrates another way to implement current scaling by replacing Q2 or Q4 of FIGS. 1(a) and 1(c) with two output transistors connected in parallel.
Figure 2A:
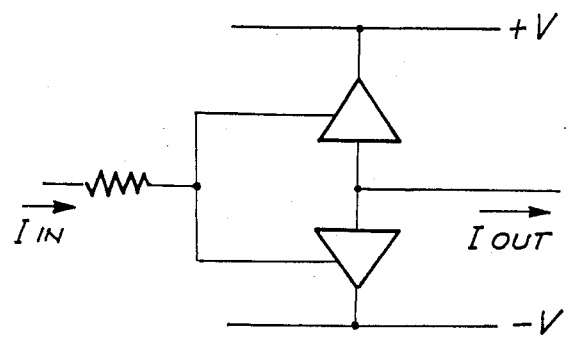
FIG. 2 schematically illustrates three inverter configurations in accordance with the invention, FIG. 2(a) illustrating a normalized inverter, FIG. 2(b) illustrating an un-normalized inverter, and FIG. 2(c)

If the elements of FIG. 1 are combined to make an inverter capable of pull-up and pull-down functions, two possibilities arise: firstly the "normalized inverter" of FIG. 2(a) with a resistor at its input. This inverter will accept any input drive capable of either sinking the input to the negative power line (−V) or sourcing to the positive power line (+V). The resultant input current is then determined by the resistor, the power supply voltage, and the voltage drop at the gate input (which is typically 0.6 V for silicon devices). The output current available from the inverter, if all transistors are matched in size, is roughly equal to this input current.

Figure 2B:
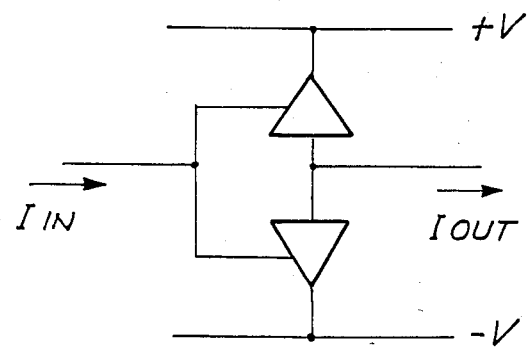

The "normalized" inverter stage of FIG. 2(a) is capable of driving other logic elements. For example the "inverter" shown in FIG. 2(b) may be driven by the "normalized inverter" and the output currents available will be equal to the input currents provided that the transistor current gains are high and that all transistors are well matched.

Figure 2C:
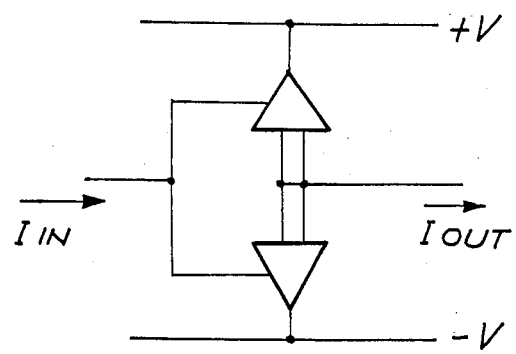

If transistor area ratios are scaled such that the emitter area of Q2 (in FIG. 1(a)) is double that of Q1, and that of Q4 in FIG. 1(c) is double that of Q3, then an "inverter with current gain" is possible. Another way of implementing this scaling is to replace output transistor $Q_2$ or $Q_4$ of FIGS. 1(a) and (c) with two output transistors connected in parallel as shown in FIG. 1(h). In each case, a current gain of approximately two is available, and an example this situation is shown schematically in the FIG. 2(c).

Chains of logic elements with known gains can be interconnected to perform logic operations, and provided that all devices are well matched in characteristics, very few "renormalizations" of current need be performed. However, as a practical matter such good matching is only available over small chip areas, and good design practice renormalizes currents frequently, especially where multiple - valued logic elements are used.

FIG. 3 shows experimental results obtained by connecting discrete NPN and PNP devices in a "CCML" logic configuration according to the present invention.

The measured values used to derive the "CCML" curve of FIG. 3 are listed in Table 1.

TABLE 1

| POWER/DELAY CHARACTERISTICS FOR CCML LOGIC | |
|---|---|
| POWER (mW) | DELAY (ns) |
| 0.279 | 81.3 |
| 0.355 | 56.3 |
| 0.525 | 37.5 |
| 0.695 | 31.3 |
| 1.133 | 17.5 |
| 1.57 | 10.0 |
| 5.8 | 1.88 |
| 18.9 | 1.25 |

The transistors in the circuit used to derive the CCML characteristic of FIG. 3 were:
PNP: 2N5771
NPN: 2N5772
and the power supply voltage range (V+−V−) used for these measurements was from 0.795 volts (Low Speed & Low Power) to 1.505 volts (High Speed & High Power). However, full current will only flow when an input current is applied.

In comparison to the values given in Table 1, the Power and Delay characteristics for various prior art logic families are given in Table 2.

TABLE 2

| POWER/DELAY CHARACTERISTICS FOR PRIOR ART LOGIC FAMILIES | | |
|---|---|---|
| LOGIC FAMILY | POWER (mW) | DELAY (ns) |
| 10K ECL | 50 | 2 |

TABLE 2-continued

| POWER/DELAY CHARACTERISTICS FOR PRIOR ART LOGIC FAMILIES | | |
|---|---|---|
| LOGIC FAMILY | POWER (mW) | DELAY (ns) |
| STTL | 20 | 4 |
| LSTTL | 4 | 10 |
| FAST | 4 | 3 |

It will be seen that the CCML inverter delay and power drain are lower than the prior art integrated circuit logic families shown, and that both very low power drain (at low power supply voltage) and very high speed (at high power supply voltage) are possible. This high speed performance is derived from the non-saturating operation of the current mirror elements; bipolar transistors are fastest when held out of saturation.

A second embodiment of this invention is shown in FIG. 4. The cells shown here differ from those shown in FIG. 1 by the inclusion of Schottky clamp diodes D1 and D2. This type of diode is used in logic families such as "Schottky Transistor-Transistor Logic" (STTL) to prevent a transistor collector-emitter voltage from falling much below its base-emitter voltage; by preventing transistor saturation the speed of the logic is increased. In the present "CCML" logic family, such clamping is only necessary when $Q_{12}$ or $Q_{14}$ (in FIGS. 4(a) & (c)) are required to drive a normalizing input containing a resistor or other current-limiting device. Otherwise the Schottky device is strictly not necessary.

Other embodiments of the invention may make use of different current mirror designs and FIGS. 5(a), (b) and (c) illustrate some possible current mirror designs. FIGS. 5(a) and (b) illustrate some popular current mirror configurations using NPN transistors. These are capable of providing logic functions similar to the preceding designs, when combined with complementary (PNP) transistor current mirrors. FIG. 5(a) illustrates a bipolar current mirror circuit which is less dependent upon transistor gain than the circuit of FIG. 1(a) while FIG. 5(b) illustrates a circuit which is less output voltage dependent than that of FIG. 1(a). FIG. 5 (c) illustrates one possible current mirror circuit using N-Channel enhancement MOS field effect transistors (MOSFETs). When combined with p-channel current mirror cells this arrangement is also suitable for use in embodiments of "CCML" logic in accordance with the invention. The resistor shown in FIG. 5(c) provides a current return path for the input signal. Bipolar embodiments are preferred in CCML Logic however, since they require lower operating voltages, and have lower signal swing voltages.

A full adder implementation using the principles of the present invention is illustrated in FIG. 6. The circuit works on summation of current: These currents can add or subtract to yield a net upward or downward signal swing at the output.

The adder of FIG. 6 has normalized sum and carry output buffers 10 and 11 and the transfer function of the adder is given in the Truth Table in Table 3. It will be noted that inputs A, B and C are interchangeable.

TABLE 3

| TRUTH TABLE FOR FULL ADDER | | | | |
|---|---|---|---|---|
| INPUTS | | | OUTPUTS | |
| A | B | C | SUM | CARRY |
| 0 | 0 | 0 | 0 | 0 |

TABLE 3-continued

| TRUTH TABLE FOR FULL ADDER | | | | |
|---|---|---|---|---|
| INPUTS | | | OUTPUTS | |
| A | B | C | SUM | CARRY |
| 1 | 0 | 0 | 1 | 0 |
| 1 | 1 | 0 | 0 | 1 |
| 1 | 1 | 1 | 1 | 1 |

An embodiment of a shift register is illustrated in FIG. 7(a), wherein stage 2 can be regarded as the "slave" element for a "Master" Stage 1 latch. It will be noted that storage is fully static and that the clock line in this implementation provides two-phase non-overlapping functions on one wire. A graphical representation of the clock signal with time is given in FIG. 8. Other configurations are of course possible. This simple implementation has the disadvantage of requiring a relatively high voltage and current drive on the clock line. Two possible methods of obtaining output voltages from the shift register cells are illustrated in FIGS. 7 (b) and (c).

It will be recognised by persons skilled in the art that other known logic forms (such as a programmable logic array) can also be readily devised using this CCML logic system.

I claim:

1. An electronic logic circuit comprising:
   a positive current source,
   a negative current source, and
   an output,
   each of the positive and negative current sources having an input,
   the positive current source producing a positive current and the negative current source producing a negative current and the respective positive and negative currents being summed algebraically to produce an output current at the output of the logic circuit, and
   each of the positive and negative current sources being responsive to a current flowing in its respective input, the current produced by the respective source having a magnitude which is proportional to the magnitude of the current flowing into its input such that the output current at the output of the logic circuit is a linear function of the current flowing in each of said inputs.

2. The logic circuit of claim 1 wherein each of the current sources has a power supply node, a positive supply potential being provided for the positive current source and a negative supply potential being provided for the negative current source and the supply node of at least one of the current sources being connected to its respective supply potential via switch means such that an additional logic function is provided by the switching of said switch means and the remaining supply nodes being connected directly to their respective supply potential.

3. The logic circuit of claim 1 wherein an additional positive or negative current source is provided, the additional current source having an input and an output, and producing a current at its output which is summed algebraically with the currents produced by the first mentioned positive and negative current sources to produce the output current at the output of the logic circuit, and the current produced at the output of the additional current source having a magnitude which is proportional to a current flowing in its input.

4. The logic circuit of claim 1 wherein a reference current source, producing a known level of reference current is connected to supply said reference current to the input of one of the current sources.

5. The logic circuit of claim 4, wherein an input signal potential is provided and the reference current source comprises a resistor connected between the voltage input signal potential and the input of the respective current source.

6. The logic circuit of claim 5, wherein the input signal potential is a fixed potential.

7. The logic circuit of claim 5 wherein the input signal potential is derived from another logic circuit.

8. The logic circuit of claim 1, wherein each current source comprises a current mirror circuit in which the active elements are bipolar transistors and an output transistor of the mirror circuit is connected to deliver the output current of the mirror circuit from its collector.

9. The logic circuit of claim 8 wherein the transistors of each current mirror circuit have base emitter junction areas which are selected to give a predetermined weighting of the output current of the current mirror with respect to its input current.

10. The logic circuit of claim 1 wherein each current source comprises a current mirror circuit in which the active elements are bipolar transistors, each mirror circuit having a plurality of output transistors and each said output transistor being connected to deliver from its collector an output current having a magnitude proportional to the current flowing in the input of the respective mirror.

11. The logic circuit of claim 10 wherein the transistors of each current mirror circuit have base emitter junction areas which are selected to give a predetermined weighting to the currents flowing from the collectors of the output transistors.

12. The logic circuit of claim 1 wherein each current source comprises a current mirror circuit in which the active elements are MOS field effect transistors and an output transistor of the mirror circuit is connected to deliver the output current of the mirror circuit from its drain.

13. The logic circuit of claim 12 wherein the transistors of each current mirror circuit have gate length to width ratios selected to provide a predetermined weighting of the output current of the mirror circuit with respect to its input current.

14. The logic circuit of claim 1 wherein each current source comprises a current mirror circuit in which the active elements and MOS field effect transistors, each mirror circuit having a plurality of output transistors and each said output transistor being connected to deliver from its drain an output current having a magnitude proportional to the current flowing in the input of the respective mirror.

15. The logic circuit of claim 14 wherein the transistors of each current mirror circuit have gate length to width ratios which are selected to give a predetermined weighting to the currents flowing from the drains of the output transistors.

16. An electronic digital logic circuit comprising:
a positive current source having a positive current input and producing a positive current of magnitude proportional to the magnitude of current flowing into its input;
a negative current source having a negative current input and producing a negative current of magnitude proportional to the magnitude of current flowing into its input; and
an output terminal connected to algebraically sum the positive and negative currents produced by said sources to produce an output current at the output terminal;
said current source inputs being connectable to further current sources of predetermined magnitudes;
wherein the current sources are manufactured using bipolar junction transistor technology, the respective current sources being configured as current mirror circuits.

17. The logic circuit of claim 16 wherein at least one of said current mirror circuits includes an output transistor having a Schottky diode connected between its collector and base.

18. The logic circuit of claim 16 wherein each mirror circuit comprises an input transistor and an output transistor and wherein the base-emitter junction area ratios of the input and output transistors are selected to provide a predetermined analog weighting of the output current.

19. The logic circuit of claim 18 wherein a voltage applied to the emitter of an output transistor is switchable between predetermined discrete levels to provide an additional gating or clocking function.

20. A digital gate circuit comprising:
a positive current source having a positive current input and producing a positive current of magnitude proportional to the magnitude of current flowing into its input;
a negative current source having a negative current input and producing a negative current of magnitude proportional to the magnitude of current flowing into its input; and
an output terminal connected to algebraically sum the positive and negative currents produced by said sources to produce an output current at the output terminal;
said current source inputs being connectable to further current sources of predetermined magnitudes;
wherein the current sources are manufactured using bipolar junction transistor technology, the respective current sources being configured as current mirror circuits.

21. The gate circuit of claim 20 wherein at least one of said current mirror circuits includes an output transistor having a Schottky diode connected between its collector and base.

22. The gate circuit of claim 20 wherein each mirror circuit comprises an input transistor and an output transistor and wherein the area ratios of the input and output transistors are selected to provide a predetermined analog weighting of the output current.

23. The gate circuit of claim 22 wherein a voltage applied to the emitter of an output transistor is switchable between predetermined discrete levels to provide an additional gating or clocking function.

24. A complementary current mirror logic circuit comprising:
a first current mirror connection of plural transistors connected to a first polarity power supply and providing a first current-controlled current-source output having a current magnitude proportional to the magnitude of a first logic input current signal;
a second current mirror connection of plural transistors connected to a second polarity power supply and providing a second current-controlled current-source output having a current magnitude proportional to the magnitude of a second logic input current signal; and a logic output terminal connected to algebraically sum said first and second current-source outputs and to provide as a resultant a current-controlled current-source logic output current signal.

25. A complementary current mirror logic circuit as in claim 24 wherein said plural transistors comprise bipolar transistors.

26. A complementary current mirror logic circuit as in claim 24 wherein said plural transistors comprises MOS field effect transistors.

* * * * *